(12) United States Patent
Nagashima

(10) Patent No.: US 8,891,304 B2
(45) Date of Patent: Nov. 18, 2014

(54) NONVOLATILE SEMICONDUCTOR MEMORY DEVICE AND MEMORY SYSTEM

(75) Inventor: Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 13/039,719

(22) Filed: Mar. 3, 2011

(65) Prior Publication Data
US 2011/0216592 A1 Sep. 8, 2011

(30) Foreign Application Priority Data

Mar. 3, 2010 (JP) ................................. 2010-047013

(51) Int. Cl.
*G11C 16/04* (2006.01)
*G11C 16/06* (2006.01)

(52) U.S. Cl.
CPC ...................................... *G11C 16/04* (2013.01)
USPC ............ 365/185.11; 365/185.01; 365/185.09; 365/185.17; 365/185.24

(58) Field of Classification Search
USPC ............... 365/18.09, 185.11, 185.17, 185.24, 365/185.09, 185.01, 185.18
See application file for complete search history.

(56) References Cited

U.S. PATENT DOCUMENTS

| 7,054,195 | B2 * | 5/2006 | Matsunaga | 365/185.11 |
| 2002/0118569 | A1 * | 8/2002 | Jeong et al. | 365/185.18 |
| 2005/0083735 | A1 * | 4/2005 | Chen et al. | 365/185.17 |
| 2007/0025155 | A1 * | 2/2007 | Hwang et al. | 365/185.19 |
| 2007/0297236 | A1 * | 12/2007 | Tokiwa | 365/185.22 |
| 2009/0135658 | A1 * | 5/2009 | Park et al. | 365/185.23 |
| 2009/0207657 | A1 * | 8/2009 | Tamada | 365/185.03 |
| 2009/0310408 | A1 * | 12/2009 | Lee et al. | 365/185.03 |

FOREIGN PATENT DOCUMENTS

JP 2003-249083 9/2003

OTHER PUBLICATIONS

Japanese Office Action Issued Mar. 19, 2013 in Patent Application No. 2010-047013 (with English translation).

* cited by examiner

*Primary Examiner* — Tha-O H Bui
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array includes blocks, each of the blocks includes NAND strings that each comprise memory cells serially connected in a first direction, word lines respectively connected to memory cell groups arranged in a second direction in the block, and a controller configured to perform a process (A) of verifying one of states in which all of the memory cells included in the block are turned on (pass) and at least one memory cell is turned off (fail) by use of a first read voltage applied to unselected word lines in a data read time, and to perform a process (B) of reading data from the fail block by use of a second read voltage that is higher than the first read voltage and applied to the unselected word lines.

12 Claims, 17 Drawing Sheets

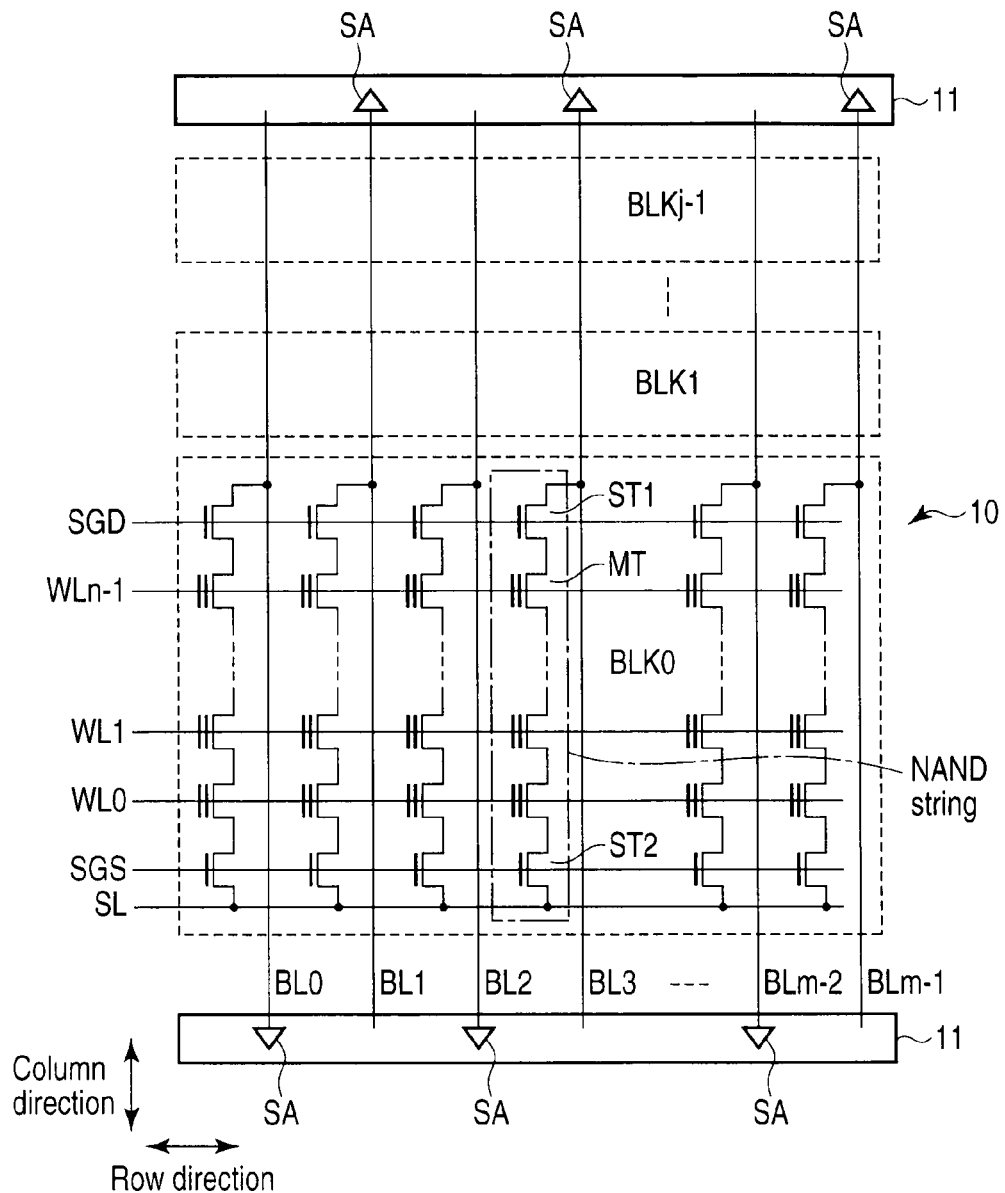
F I G. 2

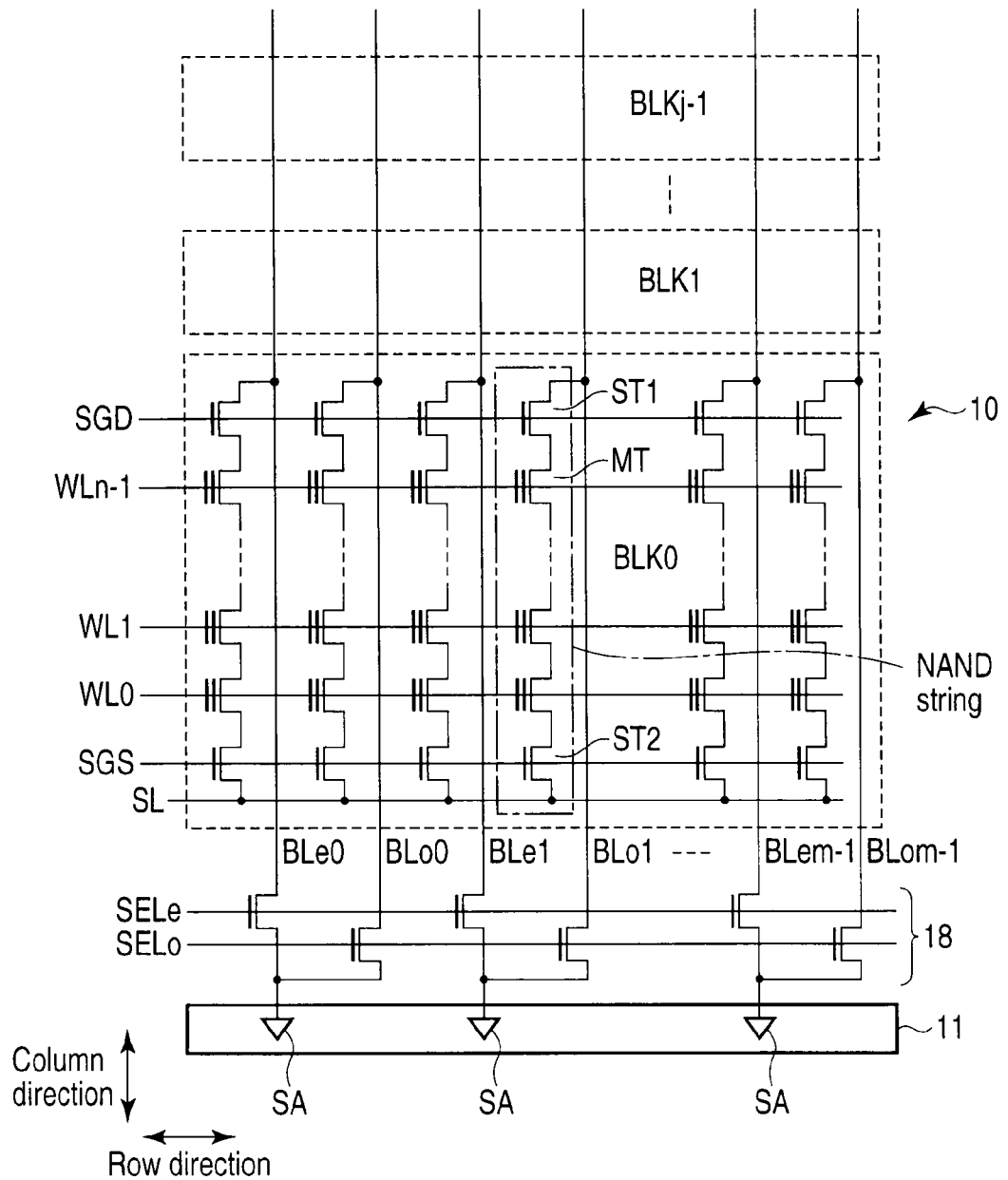
F I G. 3

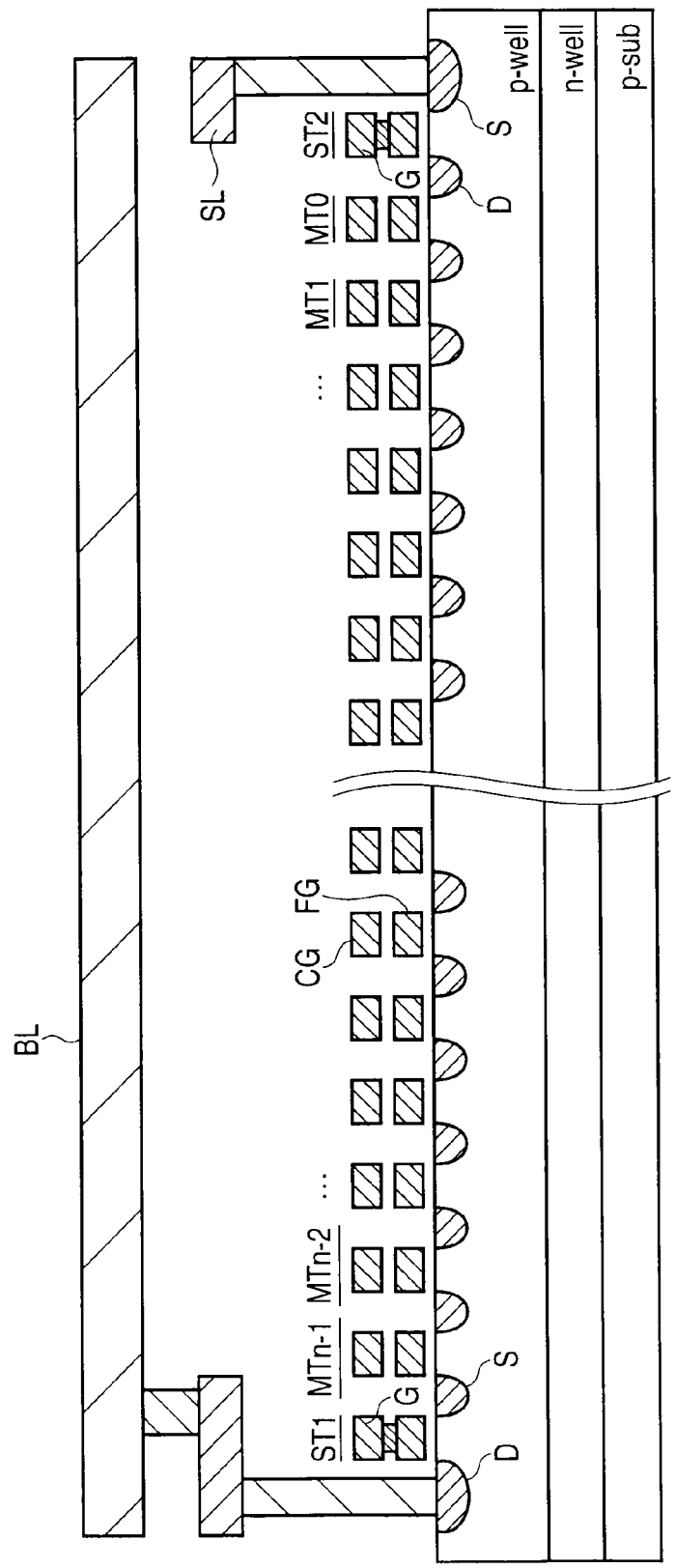
F I G. 4

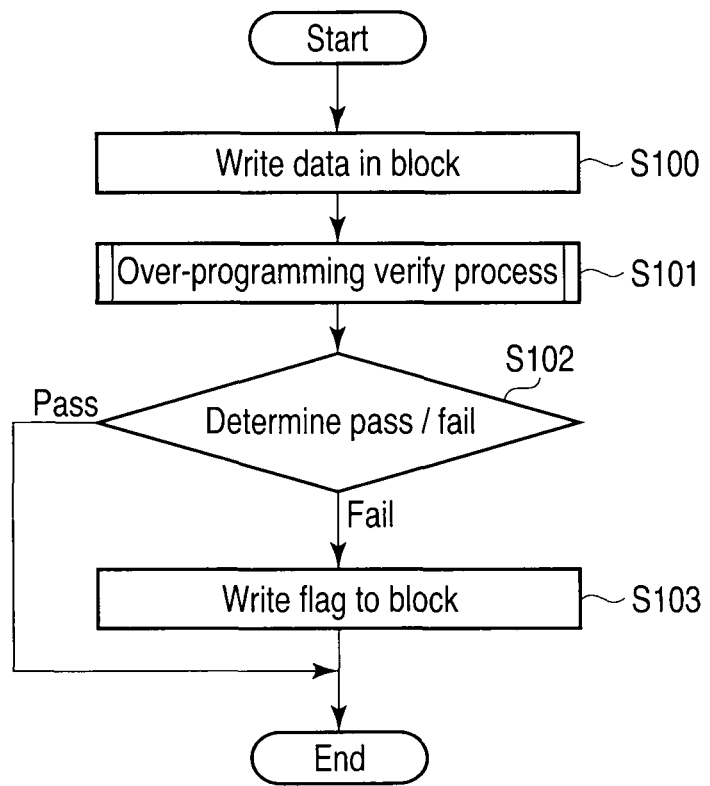
F I G. 6

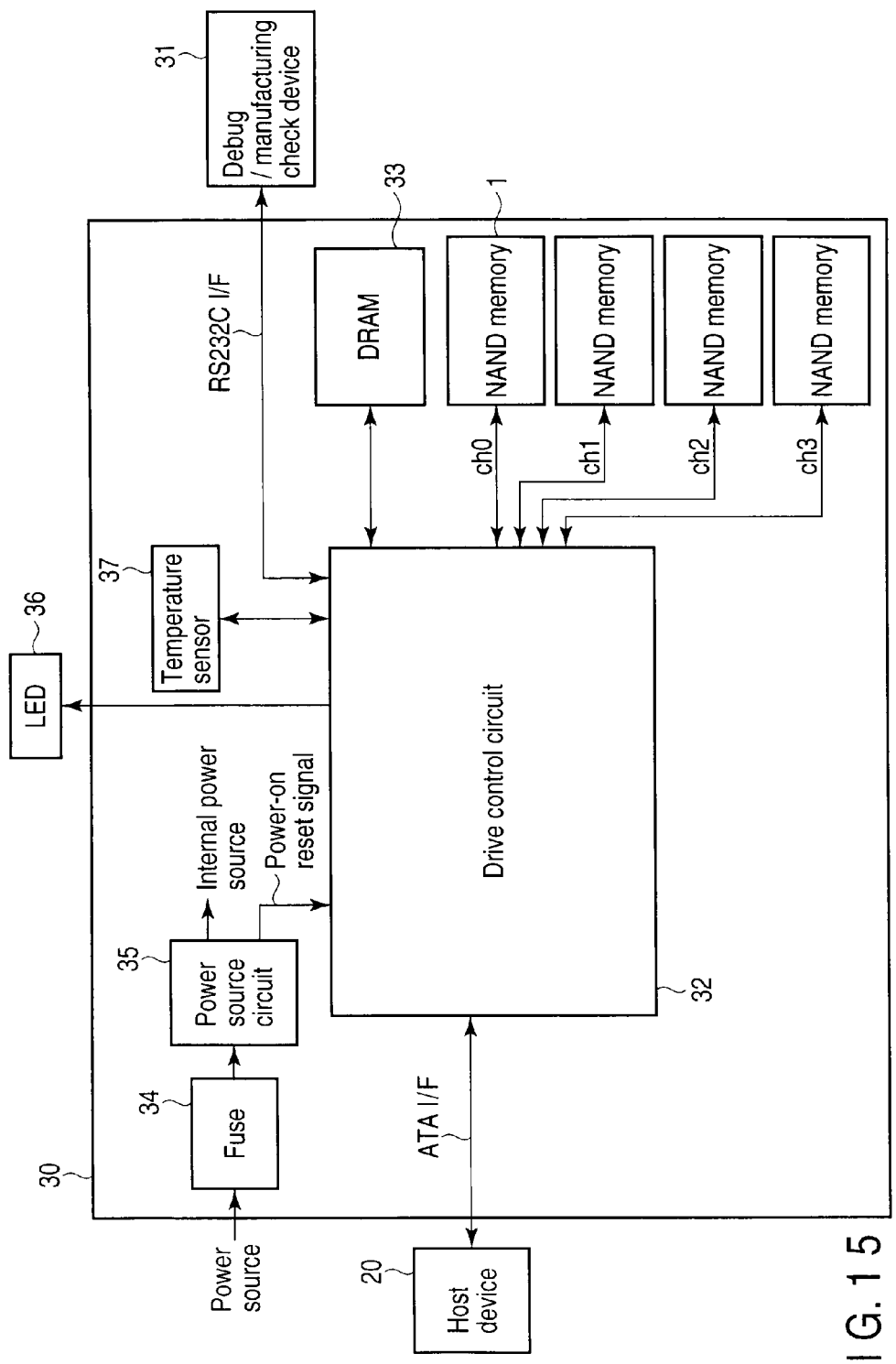
F I G. 15

Logical / physical address conversion table

| Logical block address | Physical block address | Flag |
|---|---|---|
| 0x0000 | 0x0005 | 0 |
| 0x0001 | 0x0010 | 1 |
| 0x0002 | 0xFFFF | 0 |
| 0x0003 | 0xFFFF | 0 |
| ⋮ | ⋮ | ⋮ |

NONVOLATILE SEMICONDUCTOR MEMORY DEVICE AND MEMORY SYSTEM

CROSS-REFERENCE TO RELATED APPLICATIONS

This application is based upon and claims the benefit of priority from Japanese Patent Application No. 2010-047013, filed Mar. 3, 2010; the entire contents of which are incorporated herein by reference.

FIELD

Embodiments described herein relate generally to a nonvolatile semiconductor memory device and memory system.

BACKGROUND

As an electrically rewritable nonvolatile semiconductor memory device that can be formed with high integration density, a NAND flash memory is known. The NAND flash memory includes a plurality of blocks each of which is the minimum unit of data erase. Each block includes a plurality of NAND strings each having a plurality of memory cells serially connected by forming every adjacent two of the memory cells to commonly have one of source and drain regions and both ends of each NAND string are respectively connected to bit and source lines via select gate transistors.

Each memory cell of the NAND flash memory includes a floating gate electrode formed above a semiconductor substrate with a tunnel insulating film disposed therebetween and a control gate electrode formed above the floating gate electrode with an intergate insulating film disposed therebetween and stores data in a nonvolatile fashion by utilizing variation in the threshold voltage depending on the amount of charges stored in the floating gate electrode.

BRIEF DESCRIPTION OF THE DRAWINGS

FIG. 2 is a circuit diagram showing the configuration of a memory cell array 10.

FIG. 3 is a circuit diagram showing another example of the configuration of the memory cell array 10.

FIG. 4 is a cross-sectional view showing the configuration of a NAND string.

FIG. 6 is a flowchart illustrating an over-programming detection operation of the NAND flash memory 1.

FIG. 15 is a block diagram showing the configuration of a memory system 30 according to a second embodiment.

DETAILED DESCRIPTION

Figure 1:
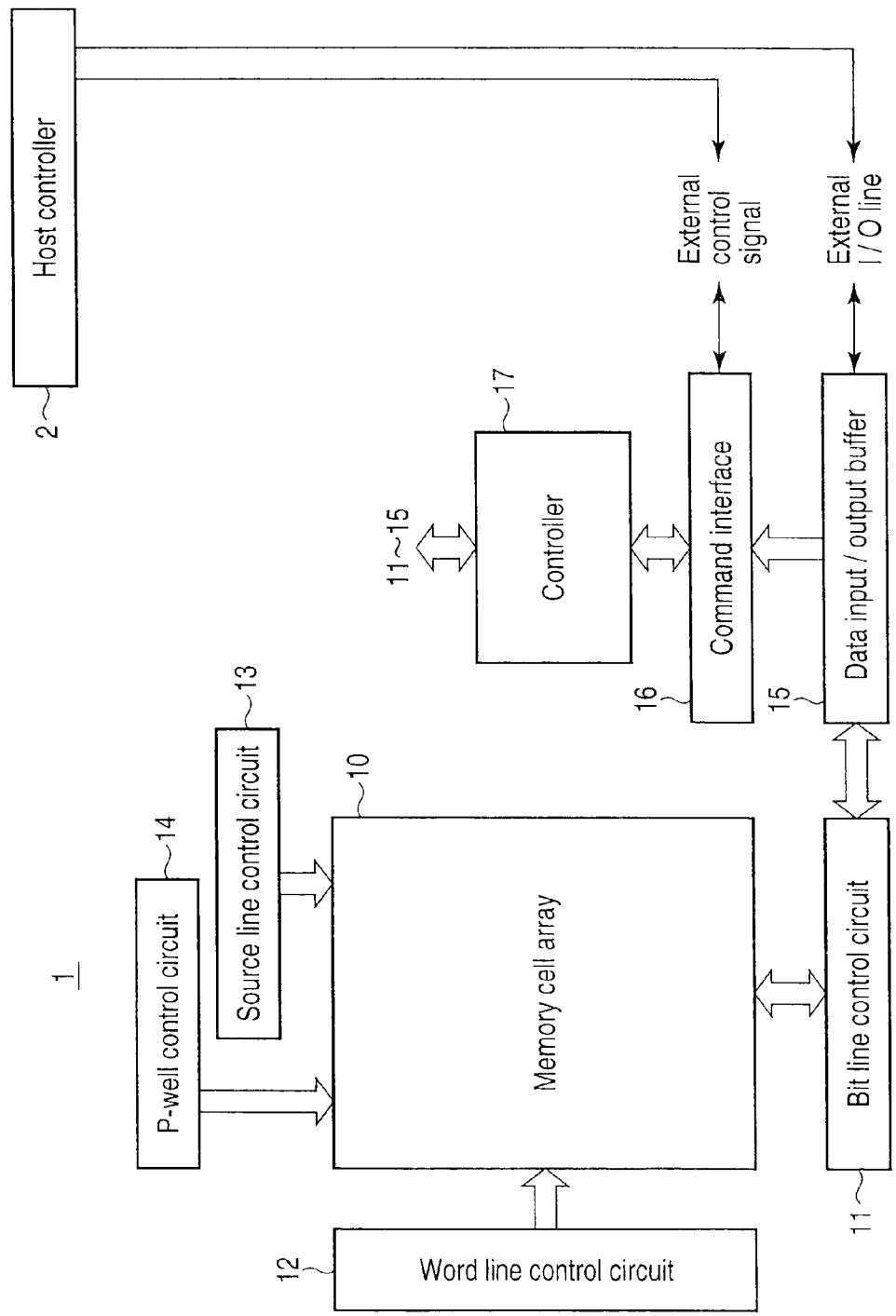
FIG. 1 is a block diagram showing the configuration of a NAND flash memory 1 according to a first embodiment.

In the NAND flash memory, when data of a selected memory cell is read, a read voltage that turns on the memory cell irrespective of stored data is applied to an unselected word line connected to unselected memory cells. However, if a so-called over-programming failure occurs in the memory cell, it becomes impossible to turn on the memory cell and, as a result, data of all of the NAND strings in the block that includes the memory cell in which the over-programming failure occurred cannot be read.

Further, as the related art of this type, a nonvolatile semiconductor memory device having an erroneous writing and excessive writing determination function is disclosed (see Jpn. Pat. Appln. KOKAI Publication No. 2003-249083).

In general, according to one embodiment, there is provided a nonvolatile semiconductor memory device comprising:

a memory cell array comprising blocks that each comprise electrically rewritable memory cells, each of the blocks comprising NAND strings that each comprise a preset number of memory cells serially connected in a first direction;

word lines respectively connected to memory cell groups arranged in a second direction that intersects with the first direction in the block; and a controller configured to perform a process (A) of verifying one of states in which all of the memory cells included in the block are turned on (pass) and at least one memory cell is turned off (fail) by use of a first read voltage applied to unselected word lines in a data read time, and to perform a process (B) of reading data from the fail block by use of a second read voltage that is higher than the first read voltage and applied to the unselected word lines.

The embodiments will be described hereinafter with reference to the accompanying drawings. In the description which follows, the same or functionally equivalent elements are denoted by the same reference numerals, to thereby simplify the description.

First Embodiment

FIG. 1 is a block diagram showing the configuration of a NAND flash memory 1 as a nonvolatile semiconductor memory device according to a first embodiment. A memory cell array 10 is configured to have electrically rewritable flash memory cells arranged in a matrix form. In the memory cell array 10, a plurality of bit lines BL extending in a column direction, a plurality of word lines WL extending in a row direction and source line SL extending in the row direction are arranged.

Bit lines BL are connected to a bit line control circuit 11. The bit line control circuit 11 selects one of bit lines BL, controls voltages of bit lines BL to perform operations of erasing data of the memory cell, writing data in the memory cell and reading data from the memory cell. The bit line control circuit 11 includes a column decoder, sense amplifiers SA, page buffer, data cache and the like.

Word lines WL are connected to a word line control circuit 12. The word line control circuit 12 selects one of word lines WL and selectively applies voltages required for erase, write and read operations to word lines WL. The word line control circuit 12 includes a row decoder, word line driver and the like.

A source line control circuit 13 controls a voltage of source line SL. A P-well control circuit 14 controls a voltage of a p-type well in which the memory cell array 10 is formed.

A data input/output buffer 15 is connected to an external host controller 2 via I/O lines and performs the operations of receiving write data, outputting read data and receiving an address and command. The data input/output buffer 15 supplies the received write data to the bit line control circuit 11 and receives read data read from the bit line control circuit 11. Further, the data input/output buffer 15 supplies an address from the exterior to the bit line control circuit 11 and word line control circuit 12 via a controller 17 to select a memory cell. Additionally, the data input/output buffer 15 supplies a command from the host controller 2 to a command interface 16.

The command interface 16 receives a control signal from the host controller 2 to determine whether data input to the data input/output buffer 15 is write data, a command or an address. If the data is a command, the buffer receives the command and supplies the command as a command signal to the controller 17.

The controller 17 manages the whole portion of the NAND flash memory 1. The controller 17 receives a command from the host controller 2 to manage the read, write, erase and data input/output operations.

FIG. 2 is a circuit diagram showing the configuration of the memory cell array 10. The memory cell array 10 includes j blocks BLK0 to BLKj-1 (j is an integral number not less than 1). One block BLK is the minimum unit for data erase.

Each block BLK includes m NAND strings sequentially arranged in the row direction (m is an integral number not less than 1). The drains of select transistors ST1 included in the respective NAND strings are respectively connected to corresponding bit lines BL and the gates thereof are commonly connected to select gate line SGD. The sources of select transistors ST2 included in the respective NAND strings are commonly connected to source line SL and the gates thereof are commonly connected to select gate line SGS.

Each memory cell transistor (that is also referred to as a memory cell) MT is configured by a MOSFET (Metal Oxide Semiconductor Field Effect Transistor) having a stacked gate structure formed on the p-type well. The stacked gate structure includes a charge storage layer (floating gate electrode) formed above the p-type well with a gate insulating film disposed therebetween and a control gate electrode formed above the floating gate electrode with a intergate insulating film disposed therebetween. The threshold voltage of memory cell transistor MT varies according to the number of electrons stored in the floating gate electrode and data is stored therein according to variation in the threshold voltage. Memory cell transistor MT may be configured to store one bit or store multilevel data (data of two or more bits).

The structure of memory cell transistor MT is not limited to the floating gate structure having a floating gate electrode and may be a structure whose threshold voltage can be adjusted by trapping electrons in the nitride film interface used as a charge storage layer, for example, a MONOS (Metal-Oxide-Nitride-Oxide-Silicon) type structure. Likewise, memory cell transistor MT of the MONOS structure may be configured to store one bit or store multilevel data (data of two or more bits).

In each NAND string, n (n is an integral number not less than 1) memory cell transistors MT are arranged to have the current paths serially connected between the source of select transistor ST1 and the drain of select transistor ST2. That is, n memory cell transistors MT are serially connected in the column direction while the adjacent ones of transistors MT commonly have the diffusion region (source region or drain region).

In each NAND string, the control gate electrodes of memory cell transistors MT are respectively connected to word lines WL0 to WLn-1 starting from memory cell transistor MT that is arranged nearest to the source side. Therefore, the drain of memory cell transistor MT connected to word line WLn-1 is connected to the source of select transistor ST1 and the source of memory cell transistor MT connected to word line WL0 is connected to the drain of select transistor ST2.

Each of word lines WL0 to WLn-1 commonly connects the control gate electrodes of memory cell transistors MT of the respective NAND strings in block BLK. That is, the control gate electrodes of memory cell transistors MT arranged on the same row in the block are connected to the same word line WL. The m memory cell transistors MT connected to the same word line WL are treated as one page and the data write and data read operations are performed for each page.

Further, each of bit lines BL0 to BLm-1 commonly connects the drains of select transistors ST1 of blocks BLK. That is, the NAND strings arranged on the same column in blocks BLK0 to BLKj-1 are connected to the same bit line BL. Each bit line BL is connected to a corresponding one of sense amplifiers SA included in the bit line control circuit 11.

FIG. 2 shows an example of the configuration in which each bit line BL is connected to one sense amplifier SA, but two bit lines may be connected to one sense amplifier SA. FIG. 3 is a circuit diagram showing another example of the configuration of the memory cell array 10.

The data write and read operations are independently performed for even-numbered bit lines BLe and odd-numbered bit lines BLo counted from 0. The data write or read operation is simultaneously performed for the m memory cells connected to even-numbered bit lines BLe among (2×m) memory cells connected to one word line WL and the data write or read operation is simultaneously performed for the m memory cells connected to the even-numbered bit lines Blo. Therefore, the (2×m) memory cells connected to one word line WL deal with data of two pages.

Even-numbered bit line BLe0 and odd-numbered bit line BLo0 are connected to one sense amplifier SA via a select circuit 18. Likewise, each pair of the other even-numbered bit line BLe and odd-numbered bit line BLo is connected to one sense amplifier. The selection operation of even-numbered bit line BLe and odd-numbered bit line BLo is performed by use of select lines SELe and SELo.

FIG. 4 is a cross-sectional view showing the configuration of a NAND string. An n-type well (n-well) is formed in a p-type semiconductor substrate (p-sub) and a P-type well (P-well) is formed in the n-type well (n-well). Each memory cell transistor MT is configured by a MOSFET that has a stacked gate structure formed on the p-type well and includes $n^+$-type diffusion regions having impurities of high concentration doped in the p-type well. The stacked gate structure includes a floating gate electrode FG and control gate electrode CG.

Select transistor ST1 is configured to include source region S and drain region D that are separately formed in the P-type well, a gate insulating film formed on the channel region between source region S and drain region D and gate electrode G formed on the gate insulating film. The configuration of select transistor ST2 is the same as that of select transistor ST1.

Figure 5:
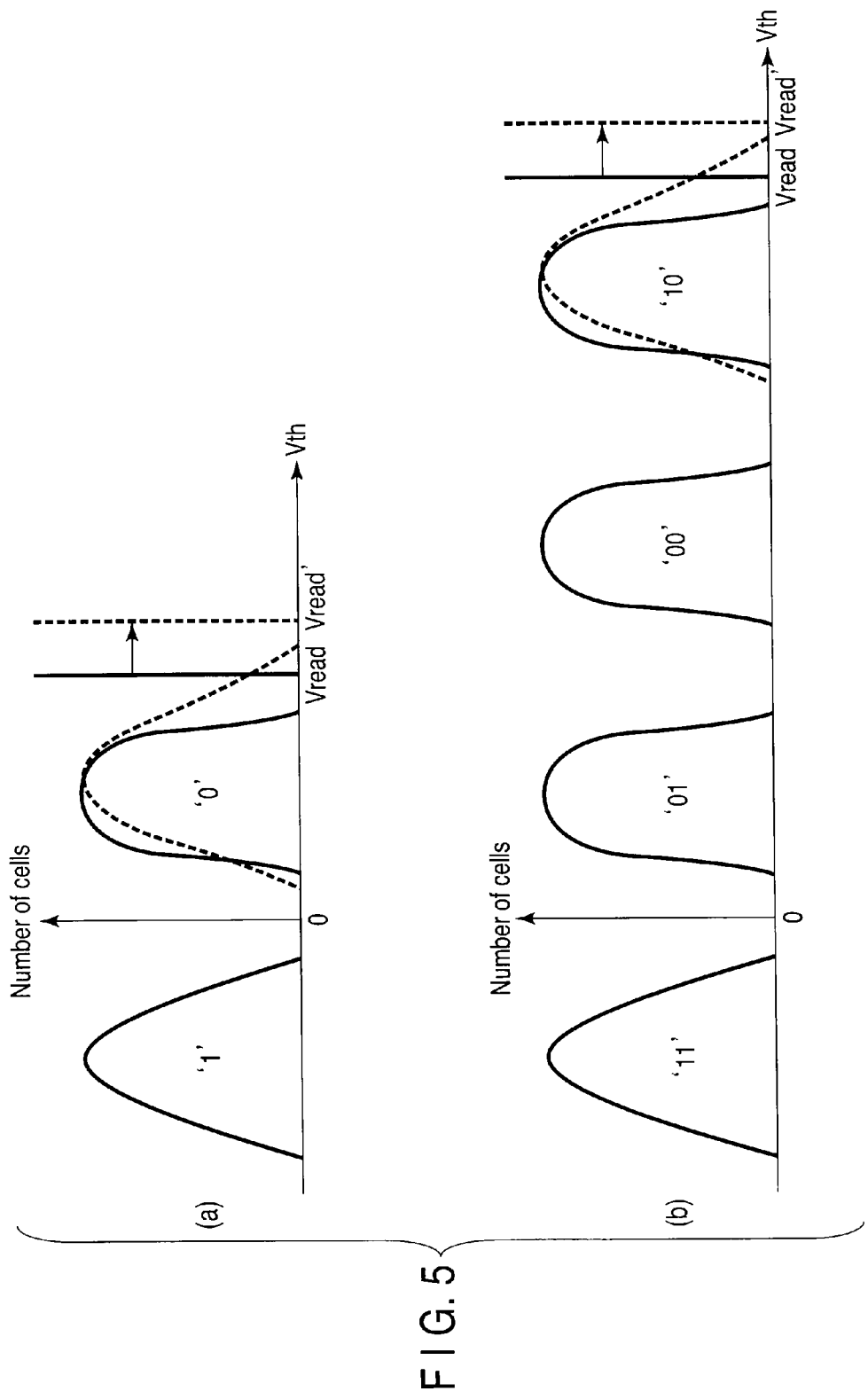
FIG. 5 is a schematic diagram illustrating the threshold voltage distribution of memory cell transistor MT.

FIG. 5 is a schematic diagram for illustrating the threshold voltage distribution of memory cell transistor MT. In FIG. 5, the threshold voltage distribution of memory cell transistor MT that stores one bit (FIG. 5(a)) and the threshold voltage distribution of memory cell transistor MT that stores two bits (FIG. 5(b)) are shown. The abscissa of FIG. 5 indicates threshold voltage Vth and the ordinate thereof indicates the number of memory cell transistors MT (the number of cells).

In the 1-bit storage system, for example, data items "1", "0" are sequentially assigned to memory cell transistors MT in an order of the lower threshold voltages. Data "1" indicates an erase state in which the threshold voltage of memory cell transistor MT is set to a negative value, for example. Data "0" indicates a write state in which the threshold voltage of memory cell transistor MT is shifted to a positive value.

In the 2-bit storage system, one of 2-bit data items "xy" defined by upper page data "x" and lower page data "y" can be stored in memory cell transistor MT. As the 2-bit data items "xy", for example, data items "11", "01", "00", "10" are sequentially assigned to memory cell transistors MT in an order of the lower threshold voltages. Data "11" indicates an erase state in which the threshold voltage of memory cell transistor MT is set to a negative value, for example. The data assignment rule is not limited to this case. Further, the configuration can be made to store three or more bits in one memory cell transistor MT.

In the lower-page write operation, data "10" is written by selectively writing lower-bit data "y" to memory cell transistor MT of data "11" (erase state). The threshold voltage distribution of data "10" before the upper-page write operation is set in an intermediate portion of the threshold voltage distributions of data "01" and data "00" after the upper-page write operation and may be set broader than the threshold voltage distribution after the upper-page write operation. In the upper-page write operation, data "01" and data "00" are respectively written by selectively writing upper-bit data "x" to the memory cell of data "11" and memory cell of data "10".

(Operation)

In the read operation of the NAND flash memory, first, voltage Vsg is applied to select gate line SGD to turn on select transistor ST1. Then, bit line BL is charged to voltage Vb1 while select transistor ST2 is kept off.

Then, unselected word line read voltage Vread that turns on the memory cells irrespective of stored data is applied to unselected word lines connected to all of the unselected memory cells other than the selected memory cell to turn on the unselected memory cells. Next, voltage Vcgr used to determine the threshold voltage of the selected memory cell is applied to the selected word line connected to the selected memory cell. Subsequently, voltage Vsg is applied to select gate line SGS to turn on select transistor ST2. For example, 0 V is applied to source line SL.

At this time, if the selected memory cell connected to the selected word line is off, the bit line is not discharged and charged voltage Vb1 is kept held. If the selected memory cell is on, the bit line is discharged and the voltage of the bit line is set to substantially the same voltage as source line SL. After this, data stored in the selected memory cell can be read by sensing the voltage of the bit line after the read operation by means of sense amplifier SA.

As shown in FIG. 5, voltage Vread is set to a voltage that causes the memory cell transistor of the highest threshold voltage to be turned on. If voltage Vread is set higher, the unselected memory cells can be turned on without fail. However, if voltage Vread is set excessively high, a so-called read disturbance in which the threshold voltage of memory cell transistor MT rises occurs by repeatedly performing the read operation, that is, repeatedly applying voltage Vread to the word line. Therefore, it is preferable to set voltage Vread to a lower level while the condition that the unselected memory cells are turned on is satisfied.

In the write operation, over-programming in which the threshold voltage of the memory cell is set to a voltage higher than voltage Vread occurs. If over-programming occurs in one memory cell of a certain NAND string, the memory cell is not turned on even when voltage Vread is applied. As a result, it becomes impossible to read data of the NAND string. Moreover, it becomes impossible to read data of a block including the NAND string in which over-programming has occurred.

In the present embodiment, voltage Vread is raised at the read time with respect to the NAND string in which over-programming occurs to perform the read operation. As a result, since a memory cell in which over-programming has occurred can be turned on, data of the NAND string can be read. Next, a system of compensating for over-programming failure is explained below.

FIG. 6 is a flowchart for illustrating an over-programming detection operation of the NAND flash memory 1. The controller 17 writes data in a desired block BLK of the memory cell array 10 (step S100). The write operation is the same as that of a general NAND flash memory.

Then, the controller 17 performs an over-programming verify process (step S101). The over-programming verify process is a process of determining whether or not over-programming occurs in all of the NAND strings included in block BLK.

Figure 7:
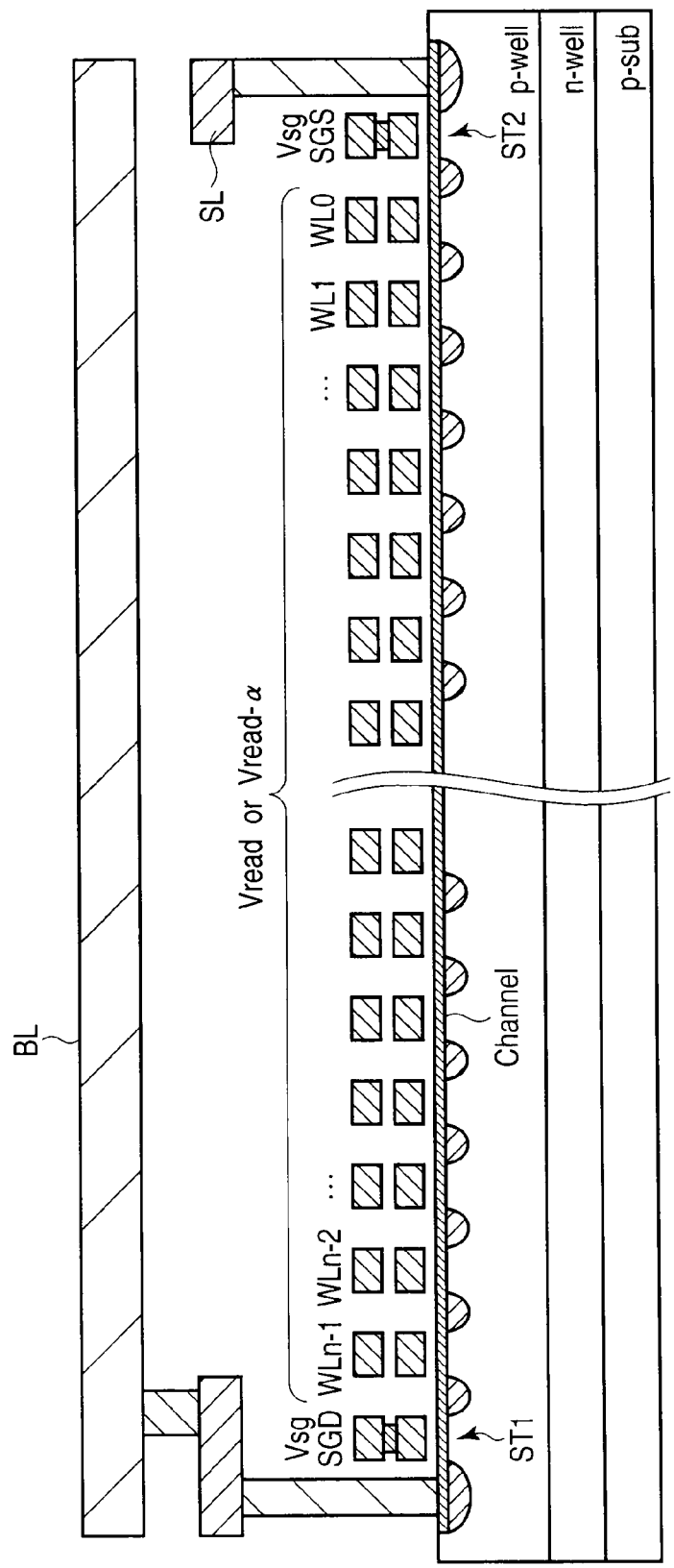
FIG. 7 is a view illustrating the relationship of voltages applied to the NAND string at the over-programming verify time.

FIG. 7 is a view for illustrating the relationship of voltages applied to the NAND string in the over-programming verify time. After bit lines BL are charged to voltage Vb1 by means of the bit line control circuit 11, the word line control circuit 12 applies voltage Vsg (approximately 4.3 V) to select gate lines SGD and SGS to turn on select transistors ST1 and ST2. Then, the word line control circuit 12 applies voltage Vread or voltage "Vread-α" slightly lower than voltage Vread to all of word lines WL0 to WLn-1 in block BLK. Since memory cells whose threshold voltages are set to approximately Vread can be detected if voltage "Vread-α" is used, an over-programming detection operation with higher reliability can be performed.

Next, the bit line control circuit 11 detects a voltage of bit line BL and determines whether bit line BL is discharged or not. If all of the memory cells in the NAND string are turned on by voltage Vread (or "Vread-α"), the NAND string is electrically connected by means of the channels to discharge bit line BL as shown in FIG. 7. If bit line BL is discharged, it means that a memory cell in which over-programming has occurred is not present in the NAND string. If bit line BL is not discharged, it means that at least one memory cell that is turned off is present in the NAND string, that is, at least one memory cell in which over-programming has occurred is present in the NAND string.

It is determined as "pass" by means of the bit line control circuit 11 if over-programming does not occur and it is determined as "fail" if over-programming occurs (step S102). In the pass/fail determination process, it is determined as "pass" if no NAND string in which over-programming occurs is present in block BLK and it is determined as "fail" if at least one NAND cell is present. Further, the number of NAND strings in which over-programming occurs may counted and it can be determined as "fail" if the count exceeds a freely set fail threshold value.

Figure 8:
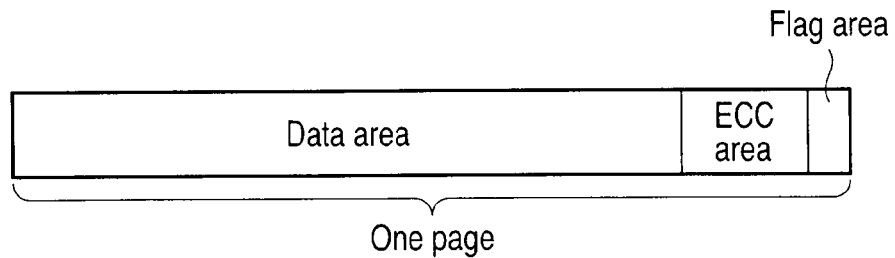
FIG. 8 is a schematic diagram showing a flag area.

Subsequently, the controller 17 writes the result of an over-programming verify process to a redundant region of block BLK as a flag (step S103). The flag capacity is one bit. FIG. 8 is a schematic diagram showing a flag area. FIG. 8 shows a storage area of a given one page of block BLK. One page includes a data area that stores user data, management information and the like, an ECC area that stores ECCs (Error Correction Codes) and a flag area that stores a flag for over-programming. The flag area is assigned by use of the redundant area of one page. The page in which the flag is stored is managed by management information formed by the controller 17. Thus, since a flag indicating the result of an over-programming verify process is stored in block BLK, whether or not over-programming occurs in the block can be determined by confirming the flag.

Figure 9:
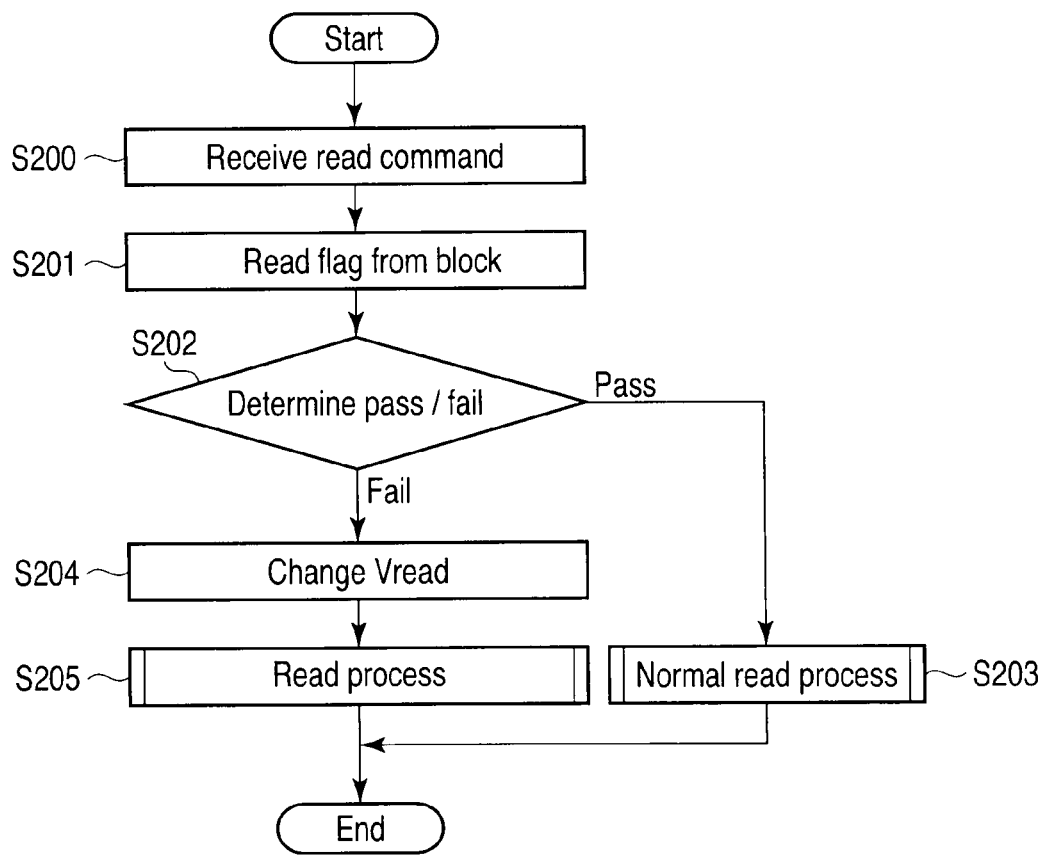
FIG. 9 is a flowchart illustrating a data read operation of the NAND flash memory 1.

Next, the data read operation is explained. FIG. 9 is a flowchart for illustrating a data read operation of the NAND flash memory 1.

First, the controller 17 receives a read command from the host controller 2 (step S200). Then, the controller 17 reads a flag stored in to-be-read block BLK (step S201). The read operation is the same as a general read operation. As described before, a page in which the flag is written is managed according to management information formed by the controller 17. Then, the controller 17 confirms (refers to) the state of the read flag (step S202).

When the flag is pass, no memory cell in which over-programming has occurred is present in block BLK. Therefore, the controller 17 performs a normal read process according to voltage Vread (step S203). The read process is performed with respect to a page corresponding to an address included in the read command sequence.

When the flag is fail, a memory cell in which over-programming has occurred is present in block BLK. Therefore, the controller 17 changes unselected word line read voltage Vread, that is, changes the voltage to unselected word line read voltage Vread' higher than Vread as shown in FIG. 5 (step S204). The controller 17 and word line control circuit 12 perform a read process according to voltage Vread' (step S205).

Figure 10:
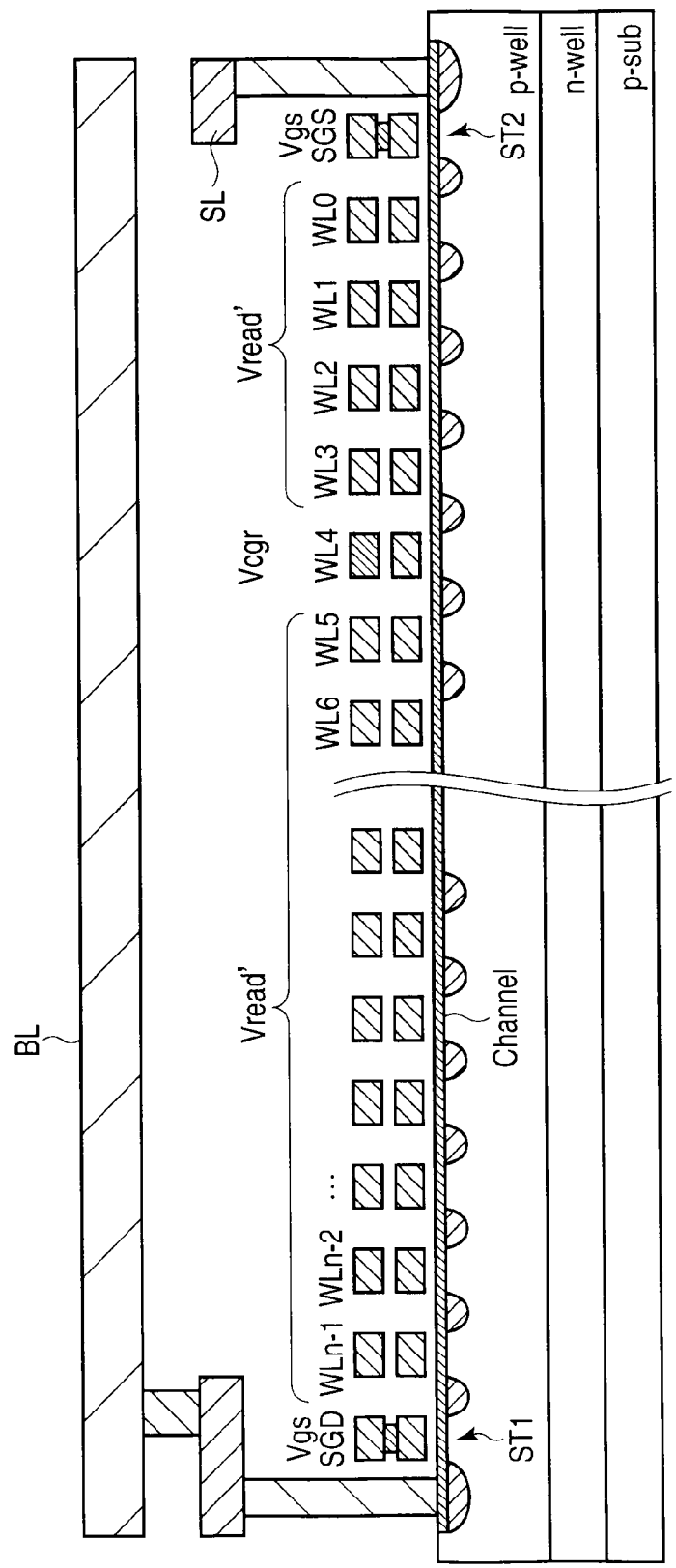
FIG. 10 is a view illustrating the relationship of voltages applied to the NAND string at the read process time.

FIG. 10 is a view for illustrating the relationship of voltages applied to the NAND string at the time of the read process using voltage Vread'. For example, it is assumed that a memory cell connected to word line WL4 is selected.

After bit line BL is charged to voltage Vbl by means of the bit line control circuit 11, the word line control circuit 12 applies voltage Vsg (approximately 4.3 V) to select gate lines SGD and SGS to turn on select transistors ST1 and ST2. Then, the word line control circuit 12 applies read voltage Vcgr used to determine stored data in the selected memory cell to selected word line WL4 connected to the selected memory cell and applies unselected word line read voltage Vread' higher than Vread to unselected word lines WL connected to all of the other unselected memory cells. As a result, all of the unselected memory cells are turned on.

Next, the bit line control circuit 11 detects a voltage of bit line BL to determine whether bit line BL is discharged or not. Then, the circuit reads data of the selected memory cell according to the determination result. In FIG. 10, a state in which the selected memory cell is turned on by read voltage Vcgr, that is, a state in which the NAND string is electrically connected by means of the channels is shown. Data read by means of the bit line control circuit 11 is output to the host controller 2 via the data input/output buffer 15.

(Effect)

As described above in detail, in the first embodiment, unselected word line read voltage Vread is applied to all of word lines WL in all of the NAND strings contained in block BLK and the over-programming verify operation is performed to determine whether bit lines BL are discharged or not. Then, a flag used to confirm whether over-programming occurs according to the determination result of the over-programming verify process is stored in the redundant area of block BLK. Subsequently, the read process is performed with respect to block BLK in which over-programming has occurred by setting unselected word line read voltage Vread higher than an original voltage at the read time.

Therefore, according to the first embodiment, a block in which data reading cannot properly be performed due to over-programming can be relieved. Therefore, the proportion defective of the NAND flash memory 1 caused by over-programming can be suppressed.

Further, it becomes unnecessary to previously set unselected word line read voltage Vread high. Therefore, the occurrence of read disturbance can be reduced.

Embodiment 1

Figure 11:
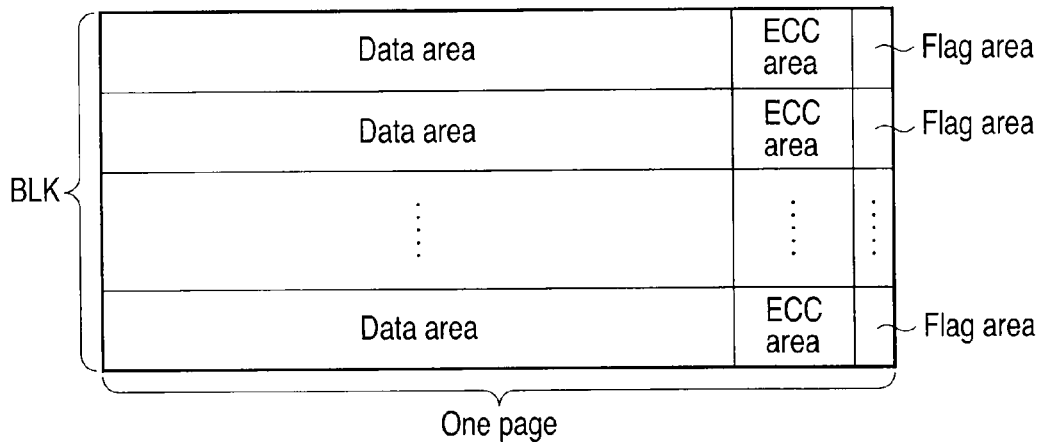
FIG. 11 is a schematic diagram showing a flag area according to embodiment 1.

Next, another example of the configuration of the storage system of a flag used to determine occurrence of over-programming is explained. FIG. 11 is a schematic diagram showing a flag area. Each page of block BLK includes a flag area used to store a flag for over-programming in addition to the data area and ECC area. The flag area is assigned by use of the redundant area of one page. The controller 17 writes the result of an over-programming verify process as a flag in the flag areas of all of the pages of block BLK at the write time.

Figure 12:
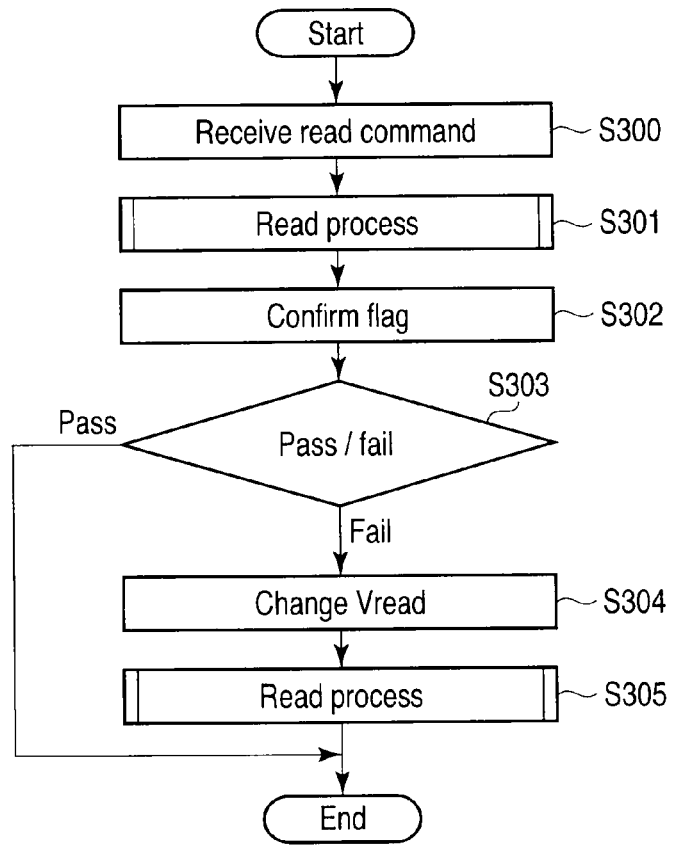
FIG. 12 is a flowchart illustrating a data read operation of the NAND flash memory 1 according to embodiment 1.

FIG. 12 is a flowchart for illustrating a data read operation of the NAND flash memory 1. First, the controller 17 receives a read command from the host controller 2 (step S300). Then, the controller 17 performs a read process of a page corresponding to an address included in the read command sequence (step S301). The read process is the same as a general read process.

Subsequently, the controller 17 confirms a flag included in the read page (steps S302, S303). If the flag is pass, no memory cell in which over-programming has occurred is present in block BLK. Therefore, the controller 17 outputs the read page as read data.

If the flag is fail, a memory cell in which over-programming has occurred is present in block BLK. Therefore, the controller 17 changes unselected word line read voltage Vread, that is, changes the read voltage to unselected word line read voltage Vread' higher than Vread (step S304). Then, the controller 17 and word line control circuit 12 perform a read process again according to voltage Vread' (step S305). After this, the controller 17 outputs a page that is subjected to the read process again as read data.

Even when the NAND flash memory is configured as in embodiment 1, the proportion defective of the NAND flash memory 1 caused by over-programming can be suppressed.

Embodiment 2

Figure 13:
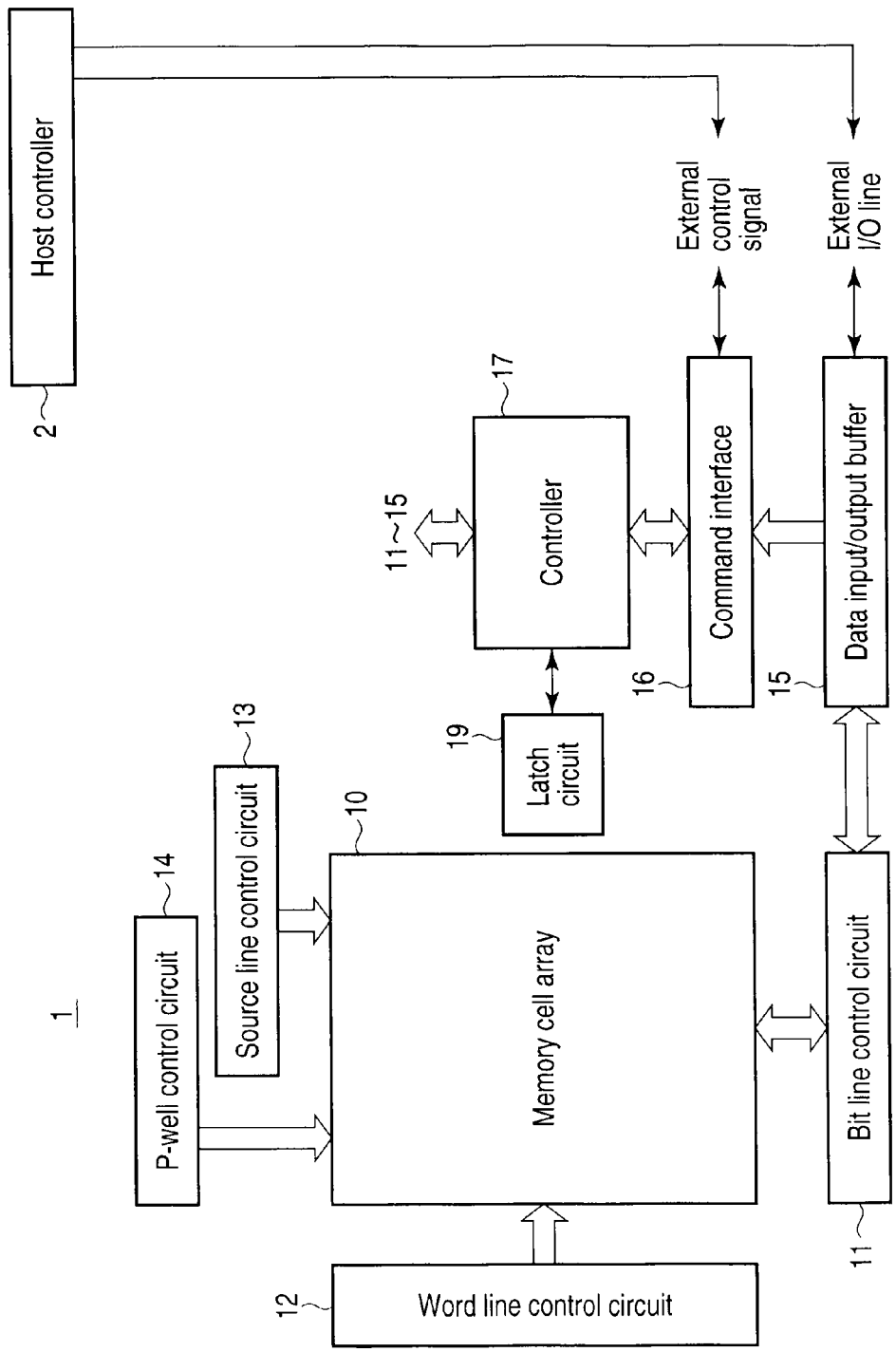
FIG. 13 is a block diagram showing the configuration of a NAND flash memory 1 according to embodiment 2.

Next, another example of the configuration of the storage system of a flag used to determine occurrence of over-programming is explained. FIG. 13 is a block diagram showing the configuration of a NAND flash memory 1 according to embodiment 2. The NAND flash memory 1 newly includes a latch circuit 19 that stores a flag used to determine occurrence of over-programming in addition to the configuration of FIG.

1. The latch circuit 19 is configured by a nonvolatile semiconductor memory such as a DRAM (Dynamic Random Access Memory) and has a memory capacity that can store the same number of bits as that of blocks.

Figure 14:
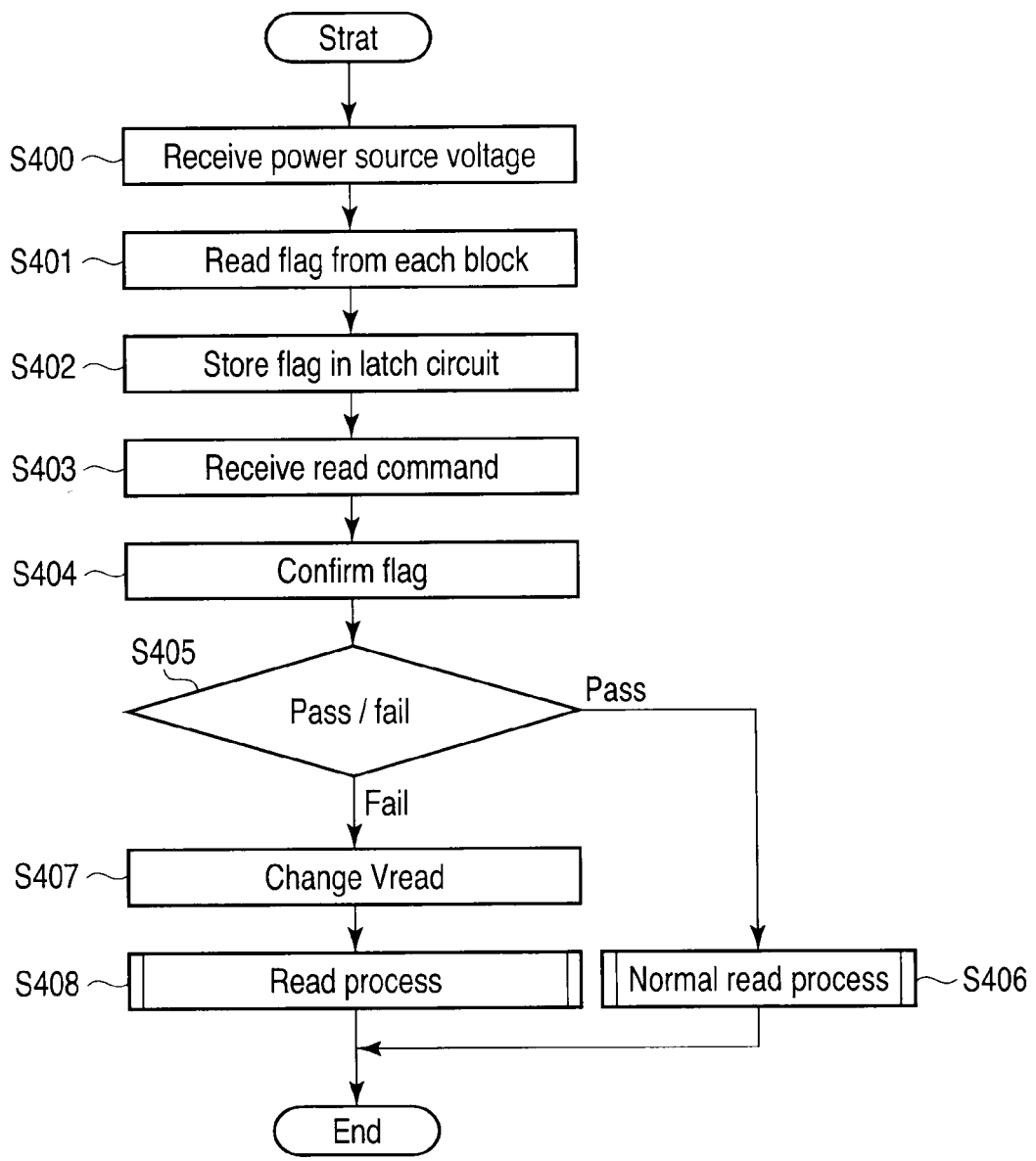
FIG. 14 is a flowchart illustrating a data read operation of the NAND flash memory 1 according to embodiment 2.

FIG. 14 is a flowchart for illustrating a data read operation of the NAND flash memory 1. In this case, the flag may be stored in a given page of each block or all of the pages.

When receiving a power source voltage from the exterior (at the power-on time) (step S400), a controller 17 reads a flag for determination of over-programming from all of blocks BLK (step S401). Then, the controller 17 stores the read flag in the latch circuit 19 (step S402).

Subsequently, the controller 17 receives a read command from the host controller 2 (step S403). Further, the controller 17 confirms a flag corresponding to to-be-read block BLK among the flags stored in the latch circuit 19 (steps S404, S405).

If the flag is pass, no memory cell in which over-programming has occurred is present in block BLK. Therefore, the controller 17 performs a normal read process using voltage Vread (step S406). The read process is performed with respect to a page corresponding to an address included in the read command sequence.

Further, if the flag is fail, a memory cell in which over-programming has occurred is present in block BLK. Therefore, the controller 17 changes unselected word line read voltage Vread, that is, changes the voltage to unselected word line read voltage Vread' higher than Vread as shown in FIG. 5 (step S407). The controller 17 and word line control circuit 12 perform a read process according to voltage Vread' (step S408).

When the NAND flash memory 1 is configured as in embodiment 2, the proportion defective of the NAND flash memory 1 caused by over-programming can be suppressed.

In the first embodiment, the control process in FIG. 6 is performed in the block unit, but may be performed in the page unit.

Further, as a method for managing the flag, the flag may be managed not in the block unit but in the unit of an area including plural blocks.

As a flag writing method, all of the flags may be collectively written in a redundant block.

Second Embodiment

A second embodiment indicates an example of the configuration as a memory system having the NAND flash memory 1 of FIG. 1 mounted thereon.

FIG. 15 is a block diagram showing the configuration of a memory system 30 according to the second embodiment. As the memory system 30, for example, an SSD (Solid State Drive) is given.

The memory system 30 is connected to a host device 20 such as a CPU (Central Processing Unit) core or a personal computer via a memory connection interface such as an ATA interface (ATA I/F) and functions as an external memory of the host device 20. Further, the memory system 30 can transfer data with respect to a debug/manufacturing check device 31 via a communication interface such as an RS232C interface (RS232C I/F).

The memory system 30 includes a NAND flash memory (that is hereinafter referred to as a NAND memory) 1 as a nonvolatile semiconductor memory, a drive control circuit 32 as a host controller, a DRAM 32 as a volatile semiconductor memory, fuse 34, power source circuit 35, status display LED 36 and a temperature sensor 37 that detects the temperature inside the drive.

The power source circuit 35 creates a plurality of different internal DC power source voltages based on an external DC power source voltage supplied from the power source circuit on the host device 20 side and supplies the internal power source voltages to the respective circuits in the memory system 30. Further, the power source circuit 35 detects a rise of the external power source voltage, generates a power-on reset signal and supplies the same to the drive control circuit 32.

The fuse 34 is provided between the power source circuit on the host device 20 side and the internal power source circuit 35 of the memory system 30. When an excessive current is supplied from the external power source circuit, the fuse 34 is cut off to prevent an erroneous operation of the internal circuit.

The NAND memory 1 is configured by the nonvolatile semiconductor memory device (NAND flash memory) 1 shown in the first embodiment. The memory system 30 includes a plurality of NAND memories 1 (in this embodiment, four NAND memories 1 are shown as an example) and the four NAND memories 1 are connected to the drive control circuit 32 via four channels (ch0 to ch3). The four NAND memories 1 can perform the parallel operation or interleave operation by use of the four channels (ch0 to ch3).

The DRAM 33 functions as a data transfer cache and work area memory between the host device 20 and the NAND memories 1. The content stored in the work area memory of the DRAM 33 is log information that is a difference in a change caused in a management table or master table (snap shot) obtained by developing various management tables stored, for example, in the NAND memory 1 at the start time or the like.

Instead of the DRAM 33, a nonvolatile random access memory such as an FeRAM (Ferroelectric Random Access Memory), MRAM (Magnetoresistive Random Access Memory) or PCRAM (Phase-Change Random Access Memory) can be used. When the nonvolatile random access memory is used, a part or the entire portion of the operation of saving various management tables to the NAND memory 1 at the power-off time can be omitted.

The drive control circuit (host controller) 32 controls data transfer via the DRAM 33 between the host device 20 and the NAND memory 1 and controls respective modules in the memory system 30. The drive control circuit 32 has a function of supplying a status display signal to the status display LED 36 and receiving a power-on reset signal from the power source circuit 35 to supply a reset signal and clock signal to the respective portions in the drive control circuit 32 and memory system 30. The drive control circuit 32 plays a role of the host controller with respect to the NAND memory 1, that is, corresponds to the host controller 2 shown in FIG. 1.

Figure 16:
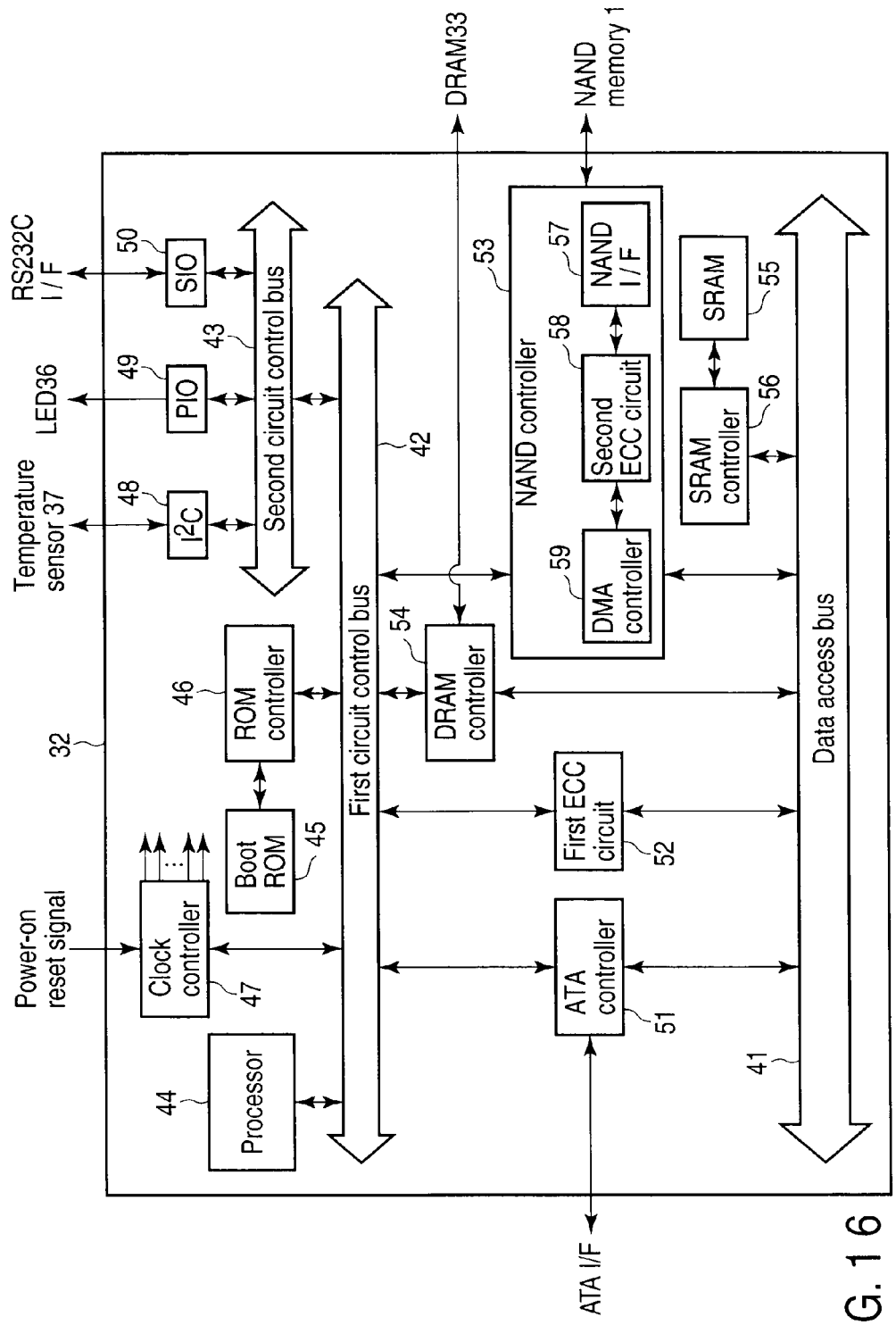
FIG. 16 is a block diagram showing an example of the internal hardware configuration of a drive control circuit 32.

FIG. 16 is a block diagram showing an example of the internal hardware configuration of the drive control circuit 32. The drive control circuit 32 includes a data access bus 41, first circuit control bus 42 and second circuit control bus 42. A processor 44 for controlling the whole portion of the drive control circuit 32 is connected to the first circuit control bus 42. Further, a boot ROM (Read Only Memory) 45 is connected to the first circuit control bus 42 via a ROM controller 46. A boot program for booting various management programs (FW: firmware) stored in the NAND memory 1 is stored in the boot ROM 45.

Further, a clock controller 47 is connected to the first circuit control bus 42. The clock controller 47 supplies a reset signal and clock signal to the respective modules in response to a power-on reset signal from the power source circuit 35.

The second circuit control bus 43 is connected to the first circuit control bus 42. To the second circuit control bus 43, an I²C circuit 48 that receives data from the temperature sensor 37, a parallel IO (PIO) circuit 49 that supplies a status display signal to the status display LED 36 and a serial IO (SIO) circuit 50 that controls the RC232C I/F are connected.

An ATA interface controller (ATA controller) 51, first ECC (Error Checking and Correcting) circuit 52, NAND controller 53 and DRAM controller 54 are connected to both of the data access bus 41 and first circuit control bus 42. The ATA controller 51 transfers data with respect to the host device 20 via the ATA I/F. An SRAM (Static Random Access Memory) 55 used as a data work area and firmware developing area is connected to the data access bus 41 via an SRAM controller 56. Firmware stored in the NAND memory 1 is transferred to the SRAM 55 by use of a boot program stored in the boot ROM 45 at the start time.

The NAND controller 53 includes a NAND I/F 57, second ECC circuit 58 and DMA (Direct Memory Access) controller 59 for DMA transfer control. The NAND I/F 57 performs an interface process with respect to the NAND memory 1. The DMA controller 59 performs an access control process between the NAND memory 1 and the DRAM 33. The second ECC circuit 58 encodes a second error correction code and encodes and decodes a first error correction code. The first ECC circuit 52 decodes a second error correction code. For example, the first and second error correction codes are a humming code, BCH (Bose Chaudhuri Hocqenghem) code, RS (Reed Solomon) code or LDPC (Low Density Parity Check) code and it is assumed that the correction ability of the second error correction code is higher than the correction ability of the first error correction code.

(Operation)

Figures 17, 18:
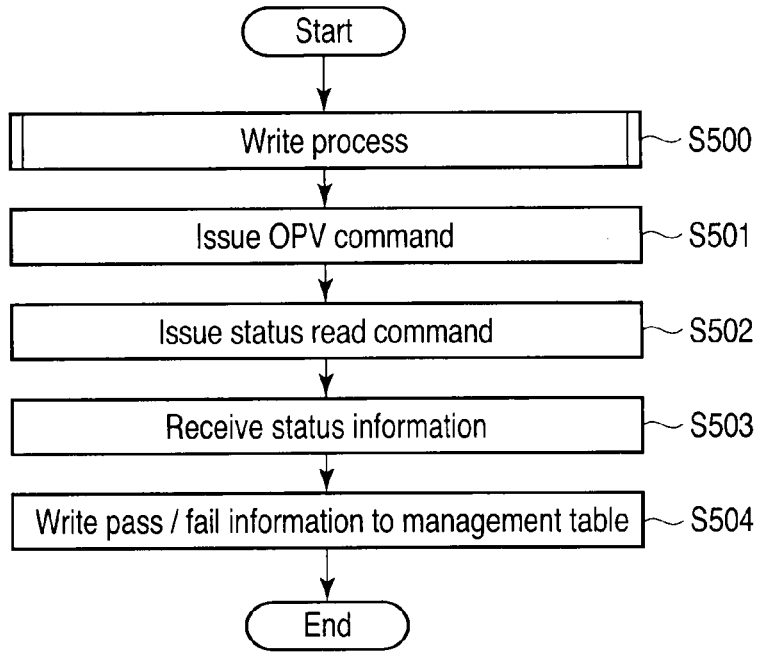
FIG. 17 is a flowchart illustrating a write operation of the memory system 30.
FIG. 18 is a diagram illustrating an example of a logical/physical address conversion table.

Next, the write operation of the memory system 30 is explained. FIG. 17 is a flowchart for illustrating the write operation of the memory system 30.

First, the drive control circuit 32 performs a write process with respect to a given block of the NAND memory 1 (step S500). Specifically, the drive control circuit 32 supplies a write command, address and data to the NAND memory 1. For example, a ready/busy signal (R/B signal) supplied from the NAND memory 1 is used as means for confirming whether the above write process is terminated or not.

After the write process to the block is terminated, the drive control circuit 32 issues an over-programming verify command (OPV command) to the NAND memory 1 (step S501). In the OPV command sequence, a block address that is subjected to an over-programming verify process is contained. The block address is an address of the block subjected to the write process in step 5500. The NAND memory 1 performs the over-programming verify process explained in the first embodiment in response to the over-programming verify command. Then, the NAND memory 1 determines whether or not over-programming occurs in a block that is subjected to the over-programming verify process. At this time, if over-programming does not occur, it is determined as pass, and if over-programming occurs, it is determined as fail.

Next, the drive control circuit 32 issues a status read command to the NAND memory 1 (step S502). The NAND memory 1 outputs status information that indicates the result ((pass/fail information) of the over-programming verify process in response to a status read command. The drive control circuit 32 receives status information from the NAND memory 1 (step S503).

Subsequently, the drive control circuit 32 writes pass/fail information to the management tables stored in the DRAM 33 and NAND memory 1 (step S504). The reason why the pass/fail information is also written in the NAND memory 1 is that the memory system 30 can be permitted to store the management table even when the power source is turned off. Thus, since the pass/fail information is contained in the management tables of the DRAM 33 and NAND memory 1, whether or not over-programming occurs in the block can be determined by confirming the pass/fail information.

As the management table that stores the pass/fail information, a logical/physical address conversion table can be used. Since the NAND flash memory has a characteristic that a data copy process between the blocks is required at the data rewrite time, the logical block address managed on the host side and the actual physical block address on the NAND flash memory side do not coincide with each other. Therefore, the logical block address is converted to the physical block address by use of the logical/physical address conversion table and then a block to be actually accessed is specified based on the thus converted physical block address.

FIG. 18 is a diagram for illustrating an example of the logical/physical address conversion table. Physical block addresses are recorded in correspondence to logical block addresses arranged in an ascending order. "0x" is a symbol expressing a hexadecimal number. "FFFF" means "unassigned". In this embodiment, a flag area is additionally provided in the logical/physical address conversion table and pass/fail information indicating the result of an over-programming verify process is stored in the flag area. Among the flags written in the flag area, data "0" indicates pass and data "1" indicates fail. The management table that stores the result of the over-programming verify process is not limited to the logical/physical address conversion table and another table (such as a table that manages wear leveling information) that manages the state of the block can be used.

Figure 19:
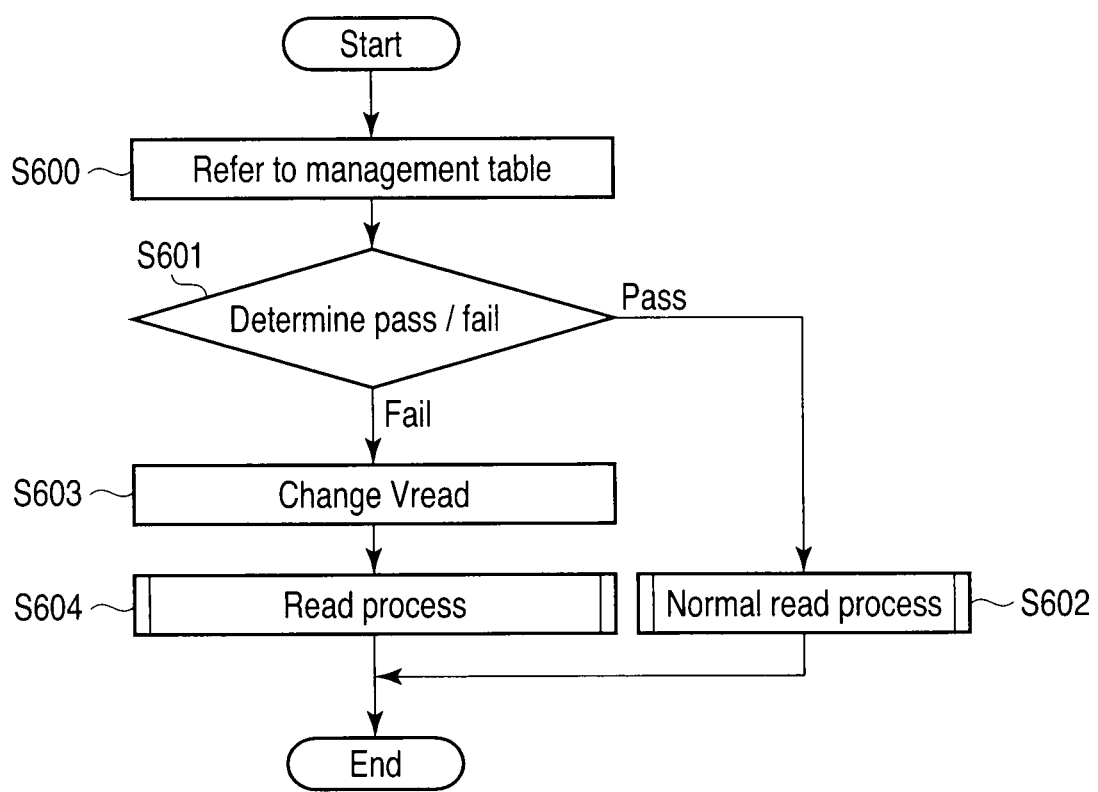
FIG. 19 is a flowchart illustrating a data read operation of the memory system 30.

Next, the data read operation is explained. FIG. 19 is a flowchart for illustrating a data read operation of the memory system 30.

First, the drive control circuit 32 refers to the management table stored in the DRAM 33 (step S600). In the management table, pass/fail information items indicating the results of over-programming verify processes are stored for respective blocks BLK as flags. Then, the drive control circuit 32 determines pass/fail of to-be-read block BLK by use of the management table (step S601).

If the flag is pass, a memory cell in which over-programming has occurred is not present in to-be-read block BLK. Therefore, the drive control circuit 32 performs a normal read process (step S602). That is, the drive control circuit 32 supplies a read command and address to the NAND memory 1 and then receives data from the NAND memory 1. On the NAND memory 1 side, a normal read process using voltage Vread is performed in response to the read command.

If the flag is fail, a memory cell in which over-programming has occurred is present in to-be-read block BLK. Therefore, the drive control circuit 32 instructs the NAND memory 1 to change unselected word line read voltage Vread, that is, change the voltage to unselected word line read voltage Vread' higher than Vread as shown in FIG. 5 (step S603). Subsequently, the drive control circuit 32 performs a read process (normal read process) (step S604). That is, the drive control circuit 32 supplies a read command and address to the NAND memory 1 and then receives data from the NAND memory 1. On the NAND memory 1 side, a read process using voltage Vread' is performed in response to the read command.

(Effect)

As described above in detail, in the second embodiment, the host controller (drive control circuit 32) writes data in a given first block of the NAND memory 1 and then instructs the NAND memory 1 to perform an over-programming verify process with respect to the first block. Then, the host controller receives pass/fail information indicating the result of an over-programming verify process from the NAND memory 1 and manages the pass/fail information by use of the management table. At the data read time, the host controller determines whether or not over-programming occurs in a to-be-read block by use of the pass/fail information of the management table. Further, the host controller instructs the NAND memory 1 to set unselected word line read voltage Vread higher than an original voltage and perform the read process with respect to the block in which over-programming occurs.

Therefore, according to the second embodiment, a block in which a data read process cannot be properly performed due to occurrence of over-programming can be relieved. As a result, the proportion defective of the memory system 30 caused by over-programming can be suppressed.

Further, it becomes unnecessary to set unselected word line read voltage Vread higher. Therefore, occurrence of read disturbance can be reduced.

Embodiment

Figure 20:
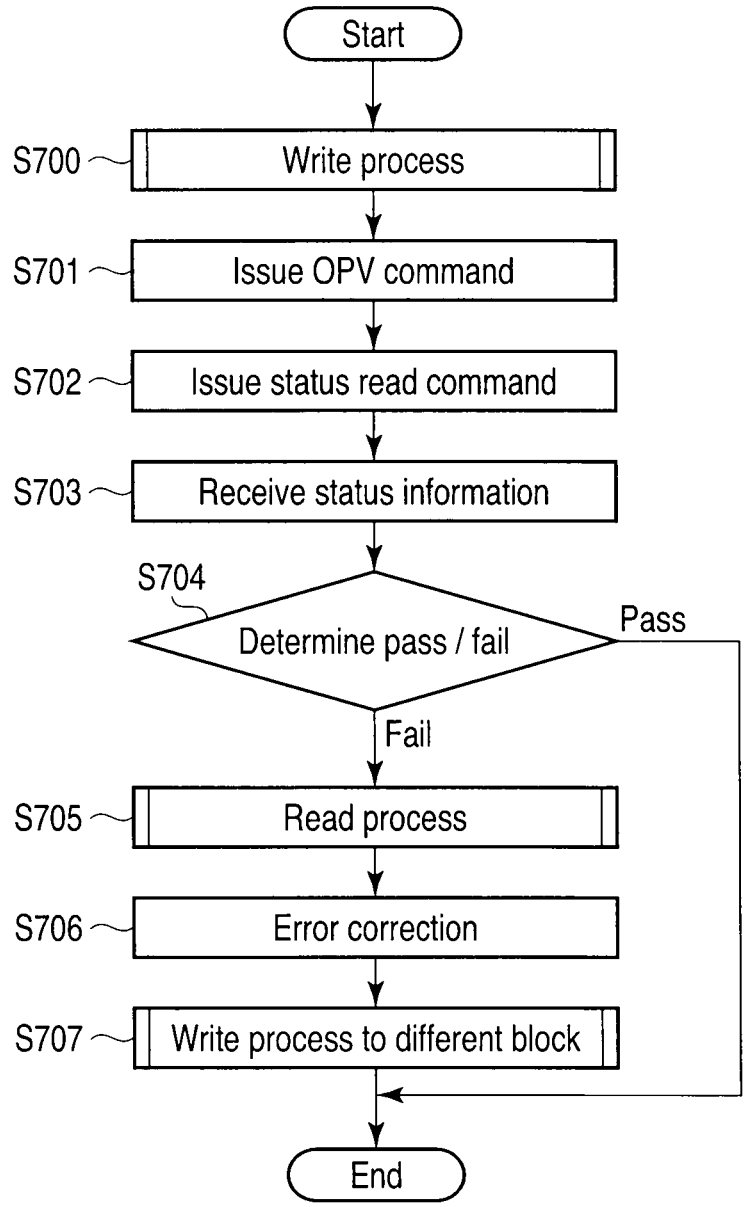
FIG. 20 is a flowchart illustrating a data write operation of a memory system 30 according to a modification.

Next, a modification of the data write operation of the memory system 30 is explained. FIG. 20 is a flowchart for illustrating a data write operation of the memory system 30 according to the modification. In FIG. 20, the process of steps S700 to S703 is the same as that of steps S500 to S503 of FIG. 17.

The drive control circuit 32 determines pass/fail of to-be-written block BLK by use of status information (pass/fail information) (step S704).

If the flag is pass, a memory cell in which over-programming has occurred is not present in to-be-written block BLK. Therefore, the drive control circuit 32 terminates a write process since data is correctly written in the NAND memory 1 in step S700.

If the flag is fail, a memory cell in which over-programming has occurred is present in to-be-written block BLK. Therefore, the drive control circuit 32 performs a data copy process of moving data of a to-be-written block to another block.

First, the drive control circuit 32 performs a read process with respect to to-be-written block BLK (step S705). That is, the drive control circuit 32 supplies a read command and address to the NAND memory 1 and then receives data from the NAND memory 1. The address is an address of a block in which over-programming has occurred.

Further, the second ECC circuit 58 included in the drive control circuit 32 performs an error correction process with respect to read data from the NAND memory 1 (step S706). By performing the error correction process, data that becomes an error due to over-programming can be corrected.

Next, the drive control circuit 32 performs a write process again with respect to a block other than the block in which over-programming has occurred (step S707). Specifically, the drive control circuit 32 supplies a write command, address and data that is error-corrected in step S706 to the NAND memory 1. The NAND memory 1 writes error-corrected data in a block other than the block in which over-programming has occurred in response to the write command. The block in which over-programming has occurred is dealt with as a bad block and is not used hereinafter. The bad block is also managed by use of the management table.

As described above in detail, according to the modification, the reliability of data stored in the NAND memory 1 can be enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell array including a plurality of blocks, each of the plurality of blocks including a plurality of memory strings and a plurality of word lines, each of the plurality of memory strings including serially connected memory cells, one end of the serially connected memory cells is coupled to a bit line through a first select transistor and another end is coupled to a source line through a second select transistor; and
    a controller configured to:
        read data by applying a first read pass voltage to unselected word lines and applying a read voltage to a selected word line;
        before a read operation is performed, apply the first read pass voltage to all of the plurality of word lines to detect an overly programmed memory cell that is not turned on even though the first read pass voltage is applied to its gate; and
        when at least one overly programmed memory cell is detected, read data by applying a second read pass voltage to the unselected word lines and applying the read voltage to the selected word line, wherein
        the second read pass voltage is higher than the first read pass voltage.

2. The device of claim 1, further comprising a word line driver circuit configured to supply both of the first and second read pass voltages.

3. The device of claim 1, further comprising a bit line control circuit coupled to the bit line and configured to determine whether or not a memory cell connected to the selected word line is turned on.

4. The device of claim 1, wherein the controller is configured to write information, in a redundant area of the block, associated with whether or not the overly programmed memory cell is detected.

5. The device of claim 4, wherein the controller is configured to check the information before reading data from the block.

6. The device of claim 1, wherein the controller is configured to count a number of memory strings in which an overly programmed memory cell is detected and if the number exceeds a threshold value, read data by applying the second read pass voltage to the unselected word lines.

7. The device of claim 1, wherein if the overly programmed memory cell is not detected, the controller is configured to read data by applying the first read pass voltage to the unselected word lines and the read voltage to the selected word line.

8. A memory system comprising:
    a nonvolatile semiconductor memory device including a memory cell array, the memory cell array including a plurality of blocks, each of the plurality of blocks including a plurality of memory strings and a plurality of word lines, each of the plurality of memory strings including serially connected memory cells, one end of the serially connected memory cells is coupled to a bit line through a first select transistor and another end is coupled to a source line through a second select transistor; and a host controller configured to:
- read data by applying a first read pass voltage to unselected word lines and applying a read voltage to a selected word line;
- before a read operation is performed, apply the first read pass voltage to all of the plurality of word lines to detect an overly programmed memory cell that is not turned on even though the first read pass voltage is applied to its gate; and
- when at least one overly programmed memory cell is detected, read data by applying a second read pass voltage to the unselected word lines and applying the read voltage to the selected word line, wherein
- the second read pass voltage is higher than the first read pass voltage.

9. The system of claim 8, wherein the nonvolatile semiconductor memory device is configured to output information, to the host controller, associated with whether or not the overly programmed memory cell is detected.

10. The system of claim 8, wherein the nonvolatile semiconductor memory device includes a word line driver circuit configured to supply both of the first and second read pass voltages.

11. The system of claim 8, wherein the nonvolatile semiconductor memory device includes a bit line control circuit coupled to the bit line and configured to determine whether or not a memory cell connected to the selected word line is turned on.

12. The system of claim 8, wherein if the overly programmed memory cell is not detected, the host controller is configured to read data by applying the first read pass voltage to the unselected word lines and the read voltage to the selected word line.

* * * * *